(12) United States Patent
Chen (10) Patent No.: US 11,915,968 B2
(45) Date of Patent: Feb. 27, 2024

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventor: Wenli Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 76 days.

(21) Appl. No.: 17/651,095

(22) Filed: Feb. 15, 2022

(65) Prior Publication Data
US 2022/0344198 A1     Oct. 27, 2022

Related U.S. Application Data

(63) Continuation of application No. PCT/CN2021/112663, filed on Aug. 16, 2021.

(30) Foreign Application Priority Data

Apr. 23, 2021 (CN) .......................... 202110441655.2

(51) Int. Cl.
*H01L 21/762* (2006.01)
*H01L 21/033* (2006.01)
*H10B 12/00* (2023.01)

(52) U.S. Cl.
CPC .... *H01L 21/76224* (2013.01); *H01L 21/0332* (2013.01); *H10B 12/34* (2023.02); *H10B 12/485* (2023.02)

(58) Field of Classification Search
CPC ........... H01L 21/76224; H01L 21/0332; H01L 23/485; H10B 12/34; H10B 12/485
See application file for complete search history.

(56) References Cited

U.S. PATENT DOCUMENTS 6,849,193 B2 * 2/2005 Hung ................ H01L 21/31116
                                                                    438/743
8,901,526 B2 * 12/2014 Nam ....................... H10B 61/22
                                                                    438/587

(Continued)

FOREIGN PATENT DOCUMENTS

CN          1947252 A        4/2007
CN         104347424 A       2/2015
(Continued)

OTHER PUBLICATIONS

J. Paul, M. Rudolph, S. Riedel, X. Thrun, S. Wege, C. Hohle, "Evaluation of an advanced dual hard mask stack for high resolution pattern transfer," Proc. SPIE 8685, Advanced Etch Technology for Nanopatterning II, 86850V (Mar. 29, 2013) (Year: 2013).*

(Continued)

*Primary Examiner* — Mary A Wilczewski
*Assistant Examiner* — Jaesun Lee
(74) *Attorney, Agent, or Firm* — Cooper Legal Group, LLC (57) ABSTRACT

The present disclosure relates to a semiconductor structure and a method for manufacturing the same. The method includes: providing a base, at least one shallow trench isolating structure being formed in the base and several active regions arranged at an interval being isolated by the shallow trench isolating structure in the base; forming a first trench in the base, a part of the active regions being exposed in the first trench; forming a first conducting structure in the first trench; forming a first dielectric layer on the base; forming a second trench in the first dielectric layer, the first conducting structure being exposed in the second trench and a width of a top of the second trench being greater than a width of a top of the first trench; and forming a second conducting structure in the second trench.

17 Claims, 5 Drawing Sheets

(56) References Cited

U.S. PATENT DOCUMENTS

| | | | |
|---|---|---|---|
| 11,309,316 B1* | 4/2022 | Chen | H10B 12/053 |
| 11,587,949 B1* | 2/2023 | Guo | H10B 41/30 |
| 2013/0154101 A1* | 6/2013 | Park | H01L 23/5226 |
| | | | 257/773 |
| 2021/0384140 A1* | 12/2021 | Huang | H01L 23/5226 |
| 2022/0344198 A1* | 10/2022 | Chen | H01L 21/0332 |
| 2022/0359525 A1* | 11/2022 | Yang | H10B 12/482 |
| 2022/0415367 A1* | 12/2022 | Yan | H10B 99/00 |
| 2023/0180462 A1* | 6/2023 | Chou | H10B 12/488 |
| | | | 257/296 |

FOREIGN PATENT DOCUMENTS

| | | | |
|---|---|---|---|
| CN | 103779318 B | | 3/2018 |
| CN | 208706648 U | * | 4/2019 |
| CN | 112490244 A | * | 3/2021 |
| CN | 113192892 A | | 7/2021 |
| KR | 20100133794 A | | 12/2010 |

OTHER PUBLICATIONS

English Translation of CN 20870664 (Year: 2019).*
International Search Report cited in PCT/CN2021/112663 dated Dec. 28, 2021, 9 pages.

* cited by examiner

| The first spin-coated hard mask layer is formed on the second dielectric layer | — S402 |
| A first silicon oxide layer is formed on a surface of the first spin-coated hard mask layer | — S404 |

SEMICONDUCTOR STRUCTURE AND METHOD FOR MANUFACTURING SAME

CROSS-REFERENCE TO RELATED APPLICATION

This is a continuation of International Application No. PCT/CN2021/112663, filed on Aug. 16, 2021, which claims priority to Chinese Patent Application No. 202110441655.2, filed to the China National Intellectual Property Administration on Apr. 23, 2021 and entitled "Semiconductor structure and method for manufacturing same". The disclosures of International Application No. PCT/CN2021/112663 and Chinese Patent Application No. 202110441655.2 are hereby incorporated by reference in their entireties.

TECHNICAL FIELD

The present disclosure relates to the technical field of integrated circuits, in particular to a semiconductor structure and a method for manufacturing the same.

BACKGROUND

A bit line contract structure filling a Bit Line Contact (BLC) hole is configured to connect a BL structure and active regions, which is an important contact structure in a Dynamic Random Access Memory (DRAM) apparatus. When the bit line contact hole is too small, the bit line contact structure in the bit line contact hole has voids, such that a resistance value of the bit line contact structure and a Write Recovery Time (TWR) of the DRAM apparatus are affected. When the bit line contact hole is too large, adjacent active regions will be hurt in a process of forming the bit line contact hole by etching, such that a contact area between a capacitor contact structure and the active regions is smaller, and when severely, the capacitor contact structure may not be contacted with the active regions.

Along with development of semiconductor technologies, the integration of DRAM apparatus is getting higher and higher, the dimensions of components in the DRAM apparatus are scaled down continuously. Under the condition that the contact area between the capacitor contact structure and the active regions is not affected, how to eliminate the voids in the bit line contact structure becomes a problem needed to be resolved immediately.

SUMMARY

According to various embodiments of the present disclosure, a semiconductor and a method for manufacturing the same are provided.

The present disclosure provides a method for manufacturing a semiconductor structure. The method includes the following operations.

A base is provided, at least one shallow trench isolating structure is formed in the base and several active regions arranged at an interval are isolated by the shallow trench isolating structure in the base.

A first trench is formed in the base, a part of the active regions is exposed in the first trench.

A first conducting structure is formed in the first trench, the first trench is filled with the first conducting structure.

A first dielectric layer is formed on the base, the first dielectric layer covers an upper surface of the base and an upper surface of the first conducting structure.

A second trench is formed in the first dielectric layer, the first conducting structure is exposed in the second trench and a width of a top of the second trench is greater than a width of a top of the first trench.

A second conducting structure is formed in the second trench.

The present disclosure provides a semiconductor structure, including a base, a first trench, a first conducting structure, a first dielectric layer, a second trench and a second conducting structure.

At least one shallow trench isolating structure is formed in the base and several active regions arranged at an interval are isolated by the shallow trench isolating structure in the base.

The first trench is located in the base, a part of the active regions is exposed.

The first conducting structure fills the first trench fully.

The first dielectric layer is located on the base.

The second trench is located in the first dielectric layer, the first conducting structure is exposed in the second trench and a width of a top of the second trench is greater than a width of a top of the first trench.

The second conducting structure is located in the second trench.

BRIEF DESCRIPTION OF THE DRAWINGS

In order to describe the technical schemes in the embodiments of the disclosure or the conventional technologies more clearly, brief introduction on drawings needed to be used in the embodiments or the conventional technologies will be made below. It is obvious that the drawings described below are merely some embodiments of the disclosure, and those skilled in the technical field further can obtain other drawings according to the drawings without creative efforts.

DETAILED DESCRIPTION OF THE EMBODIMENTS

To facilitate an understanding of the present disclosure, the present disclosure will be described below in detail with reference to the accompanying drawings. Preferred embodiments of the present disclosure are given in the accompanying drawings. However, the present disclosure may be embodied in many different forms and should not be limited to the embodiments set forth herein. Rather, these embodiments are provided so that the present disclosure will be thorough and complete.

Unless defined otherwise, all technical and scientific terms used herein have the same meaning as commonly understood by those of ordinary skill in the art to which the present disclosure belongs. The terms used herein in the specification of the present disclosure are for the purpose of describing specific embodiments only and are not intended to limit the present disclosure.

It is to be understood that when an element or a layer is referred to as being "on", "adjacent to", "connected to", or "coupled to", to other elements or layers, it may be directly on, adjacent to, connected to, or coupled to the other elements or layers, or an intervening element or layer may be present. Rather, when an element is referred to as being "directly on", "directly adjacent to", "directly connected to", or "directly coupled to" other elements or layers, it may be directly on, adjacent to, connected to, or coupled to the other elements or layers, or an intervening element or layer may be present. It is to be understood that although the terms first, second, third, and the like may be used to describe various elements, components, regions, layers, doping types, and/or parts, these elements, components, regions, layers, doping types, and/or parts should not be limited by these terms. These terms are only used to distinguish one element, component, region, layer, doping type, or part from another element, component, region, layer, doping type, or part. Therefore, a first element, component, region, layer, doping type, or part discussed below may be represented as a second element, component, region, layer, or part without departing from the teachings of embodiments of the present disclosure. For example, the first doping type may be the second doping type, and similarly, the second doping type may be the first doping type. The first doping type and the second doping type are different doping types, for example, the first doping type may be P-type and the second doping type may be N-type, or the first doping type may be N-type and the second doping type may be P-type.

Spatial relation terms such as "under", "underneath", "lower", "below", "above", "upper", and the like, may be used herein to describe a relation between one element or feature and other elements or features as illustrated in the figures. It is to be understood that in addition to the orientation shown in the figures, the spatial relation terms further include different orientations of a device in use and operation. For example, if the device in the figures is turned over, the element or feature described as "underneath the other element" or "below it" or "under it", the element or feature will be oriented "over" the other element or feature. Therefore, the exemplary terms "underneath" and "below" may include both upper and lower orientations. In addition, the device may also include additional orientations (for example, rotated 90 degrees or other orientations), and the spatial descriptors used herein are interpreted accordingly.

As used herein, the singular forms "a", "an", and "the/the" may include the plural forms as well, unless the context clearly indicates otherwise. It is also to be understood that when the terms "constituting" and/or "comprising" are used in the specification, the presence of a stated feature, integer, step, operation, element, and/or component may be determined, but the presence or addition of one or more other features, integers, steps, operations, elements, components, and/or groups is not precluded. Meanwhile, the term "and/or" used herein includes any and all combinations of the associated listed items.

The embodiments of the disclosure are described herein with reference to sectional views that are used as schematic diagrams of ideal embodiments (intervening structures) of the embodiments of the present disclosure, so that changes in shape may be expected due to, for example, a manufacturing technique and/or a tolerance. Therefore, the embodiments of the present disclosure should not be limited to special shapes of regions shown herein but include shape deviations caused by the manufacturing technique. For example, an injection region shown as a rectangle typically has a round or bending feature and/or injection concentration gradient at an edge thereof, rather than a binary change from the injection region to a non-injection region. Likewise, a burial region formed through injection may result in some injection in a region between the burial region and a surface through which the injection is performed. Therefore, the regions shown in the figures are substantially schematic, and shapes thereof neither represent actual shapes of the regions of the device nor limit the scope of the embodiments of the present disclosure.

Figure 1:
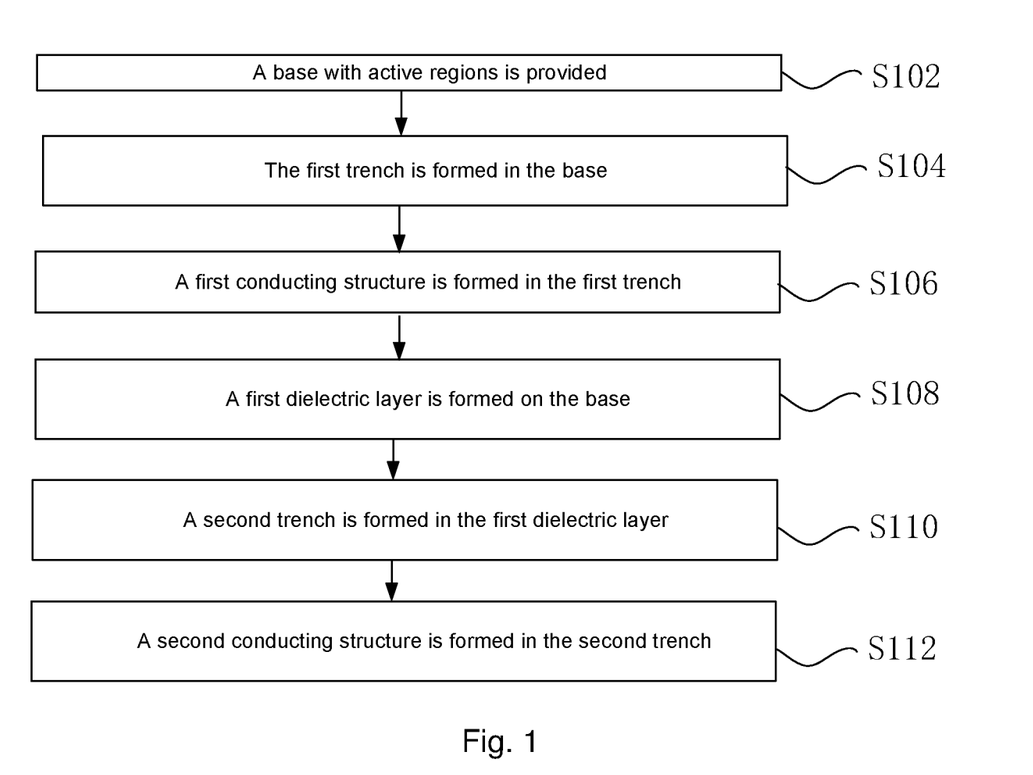
FIG. 1 is a flow diagram of a method for manufacturing a semiconductor structure in an embodiment.

Referring to FIG. 1, it is a flow diagram of a method for manufacturing a semiconductor structure in an embodiment.

In an embodiment, the present disclosure provides a method for manufacturing a semiconductor structure. As show in FIG. 1, the method includes the following steps.

In S102, a base with active regions is provided.

A base is provided, at least one shallow trench isolating structure is formed in the base and several active regions arranged at an interval are isolated by the shallow trench isolating structure in the base.

In S104, the first trench is formed in the base.

A first trench is formed in the base, a part of the active regions is exposed in the first trench. Specifically, the first trench is formed in the base by Photolithography and etching processes known to those skilled in the art, the active regions are exposed at the bottom of the first trench.

In S106, a first conducting structure is formed in the first trench.

Through a depositing process, the first trench is filled with the first conducting structure and the first conducting structure fills the first trench fully, i.e., an upper surface of the first conducting structure is aligned with a top of the first trench.

In S108, a first dielectric layer is formed on the base.

The first dielectric layer is formed on the base, the first dielectric layer covers an upper surface of the base and an upper surface of the first conducting structure.

In S110, a second trench is formed in the first dielectric layer.

The second trench is formed in the first dielectric layer by Photolithography and etching processes, the first conducting structure below the first dielectric layer is exposed through the second trench and a width of a top of the second trench is greater than a width of a top of the first trench.

In S112, a second conducting structure is formed in the second trench.

Through a depositing process, the second conducting structure is formed in the second trench.

According to the method for manufacturing the semiconductor structure of the present disclosure, first, the first trench is formed on the base and the first trench is filled with the first conducting structure fully; and then the second trench with the bottom exposed out of the first conducting structure is formed on the base and the second trench is filled with the second conducting structure, the width of the top of the second trench is greater than the width of the top of the first trench. Compared with operations of filling the conducting structures successively after the trench with the same width up and down by adopting a one-step etching process, a depth-to-width ratio of the trench when the conducting structures are formed by filling is reduced and holes are prevented from being in the first conducting structure and the second conducting structure, such that resistance of the bit line contact structure formed by the first conducting structure and the second conducting structure is further reduced.

Figure 2:
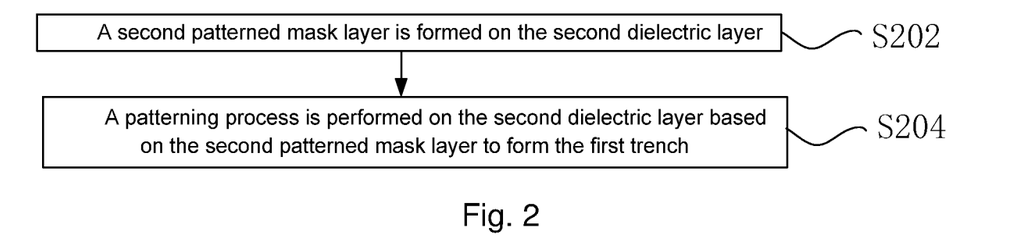
FIG. 2 is a flow diagram of forming a first trench in a base in an embodiment.
Figure 3:
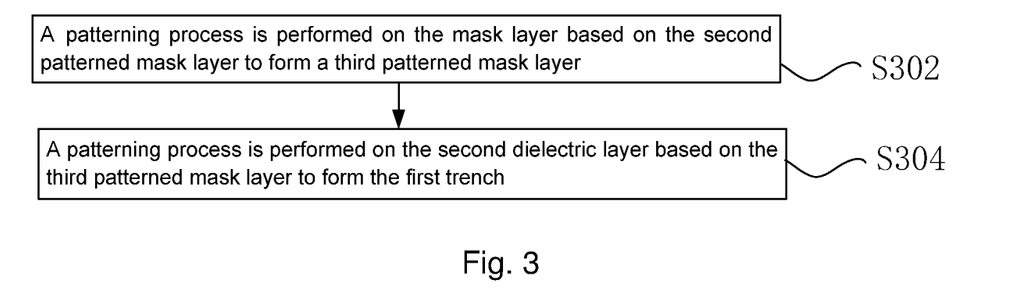
FIG. 3 is a flow diagram of forming the first trench with a second patterned mask layer in an embodiment.
Figure 4:
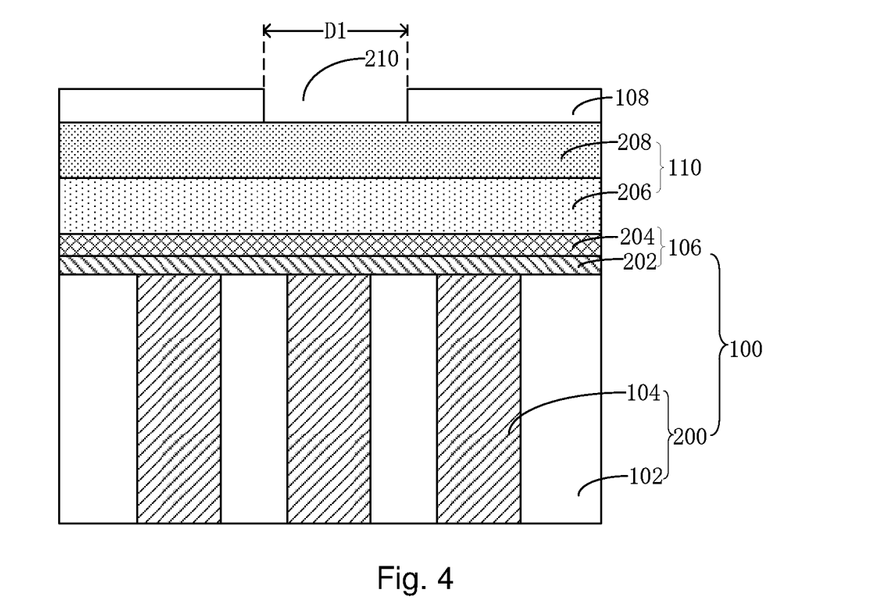
FIG. 4 is a diagrammatic cross-section of a semiconductor structure after a second patterned mask layer is formed in an embodiment.
Figure 5:
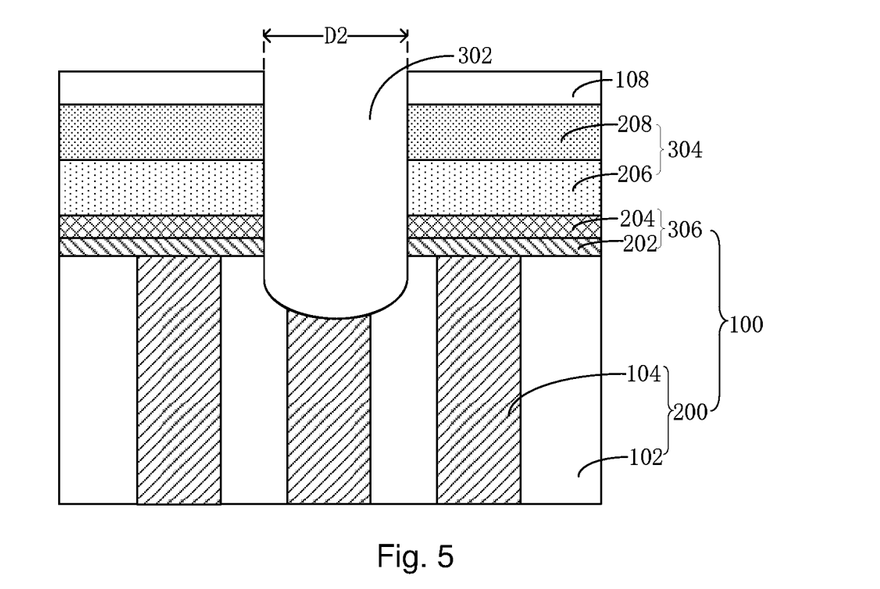
FIG. 5 is a diagrammatic cross-section of a semiconductor structure after a second trench is formed in an embodiment.
Figure 6:
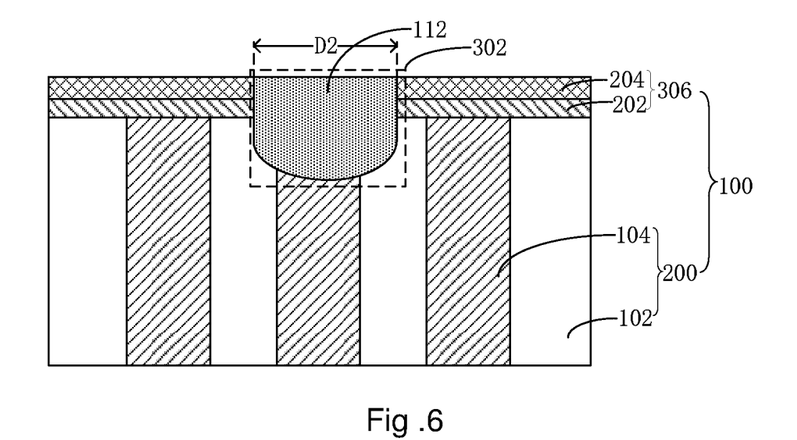
FIG. 6 is a diagrammatic cross-section of a semiconductor structure after a first conducting structure is formed in an embodiment.

Referring to FIG. 2, it is a flow diagram of forming a first trench in a base in an embodiment. Referring to FIG. 3, it is a flow diagram of obtaining a first trench with a second patterned mask layer in an embodiment. Referring to FIG. 4, it is a diagrammatic cross-section of a semiconductor structure after a second patterned mask layer is formed in an embodiment. Referring to FIG. 5, it is a diagrammatic cross-section of a semiconductor structure after a second trench is formed in an embodiment. Referring to FIG. 6, it is a diagrammatic cross-section of a semiconductor structure after a first conducting structure is formed in an embodiment.

As shown in FIG. 2, FIG. 4 and FIG. 5, in one of the embodiments, a base 100 includes a substrate 200 and a second dielectric layer 106 located on an upper surface of the substrate 200.

The S104 includes the following steps.

In S202, a second patterned mask layer is formed on the second dielectric layer.

In S204, a patterning process is performed on the second dielectric layer based on the second patterned mask layer to form the first trench.

Specifically, in S202, the second patterned mask layer 108 is formed on the second dielectric layer 106, the second patterned mask layer 108 defines a shape and a position of the first trench 302, i.e., a width D1 of a first opening 210 of the second patterned mask layer 108 is as same as a width D2 of a top of the first trench 302, and the second dielectric layer 106 under a preset region of the first trench is exposed.

Specifically, in S204, the patterning process is performed on the second dielectric layer 106 by taking the second patterned mask layer 108 as a mask to form the first trench 302. The first trench 302 penetrates through the second dielectric layer 106 and extends into the substrate, i.e., the active region 104 in the substrate 200 is exposed at the bottom of the first trench 302.

As shown in FIG. 3, FIG. 4 and FIG. 5, in one of the embodiments, before S202, the method further includes: a mask layer 110 is formed on the second dielectric layer 106.

The S204 includes the following steps.

In S302, a patterning process is performed on the mask layer based on the second patterned mask layer to form a third patterned mask layer.

In S304, a patterning process is performed on the second dielectric layer based on the third patterned mask layer to form the first trench.

In one of the embodiments, after S302, the method further includes the following step.

The second patterned mask layer is removed.

In one of the embodiments, after S304, the method further includes the following step.

The third patterned mask layer is removed.

In one of the embodiments, a process gas in the S304 includes hexachlorobutadiene, oxygen and argon.

As shown in FIG. 4, FIG. 5 and FIG. 6, specifically, the method for manufacturing the semiconductor structure includes the following steps. In the first step, first, a substrate 200 is provided, at least one shallow trench isolating structure 102 is formed in the substrate 200, several active regions 104 arranged at an interval are isolated by the at least one shallow trench isolating structure 102 in the substrate 200. Then, a second dielectric layer 106 is formed on an upper surface of the substrate 200. In the second step, a mask layer 110 is formed on the second dielectric layer 106, for example, the mask layer 110 is located on an upper surface of the second dielectric layer 106. In the third step, a second patterned mask layer 108 is formed on the mask layer 110. a first opening 210 in the second patterned mask layer 108 exposes the mask layer 110 under a preset region (the region of the first opening 210) of the first trench. In the fourth step, a patterning process is performed on the mask layer 110 by taking the second patterned mask layer 108 as a mask, the mask layer 110 under the preset region of the first trench is removed to form a third patterned mask layer 304 formed by the mask layer 110 which is remaining, and at the moment, a shape of the second patterned mask layer 108 is transferred to the third patterned mask layer 304. In the fifth step, a patterning process is performed on the second dielectric layer 106 by an etching process by taking the third patterned mask layer 304 as a mask, the second dielectric layer 106 and a part of the substrate 200 exposed in the third patterned mask layer 304 are removed to form a second dielectric structure 306 formed by the second dielectric layer 106 which is remaining and the first trench 302, the bottom of which is located in the substrate 200 and exposed at least one of the active regions 104. A process gas of the etching process includes hexachlorobutadiene, oxygen and argon. Then the third patterned mask layer 304 on the second dielectric structure 306 is removed. In some embodiments, the second patterned mask layer 108 is fully removed in a pattern process of the mask layer 110, and in some other embodiments is fully removed via a process after the third patterned mask layer 304 is formed, and in some other embodiments, the second patterned mask layer 108 is removed after the second dielectric structure 306 is formed. In the sixth step, by a hole-filling process, the first trench 302 is filled with the first conducting structure 112, a bottom of the first conducting structure 112 is in contact with the active regions 104, an upper surface of the first conducting structure 112 is aligned with an upper surface of the second dielectric structure 306, and at the moment, the diagrammatic cross-section of the semiconductor structure is as shown in FIG. 6.

Figure 7:
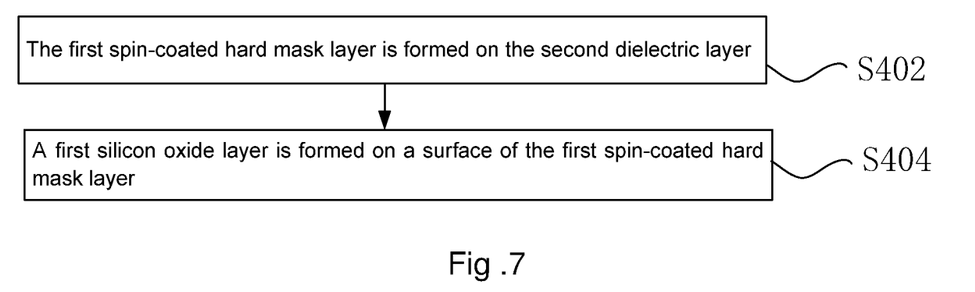
FIG. 7 is a flow diagram of forming a mask layer on a second dielectric layer in an embodiment.

FIG. 7 is a flow diagram of forming a mask layer on a second dielectric layer in an embodiment.

As shown in FIG. 4, FIG. 5 and FIG. 7, in one of the embodiments, the mask layer 110 includes a first spin-coated hard mask layer 206 and a first silicon oxide layer 208 stacked in sequence from the second dielectric layer 106, the second dielectric layer 106 includes a silicon oxynitride layer 204 formed on the substrate 200.

The step of forming the mask layer 110 on the second dielectric layer 106 includes the following steps.

In S402, the first spin-coated hard mask layer is formed on the second dielectric layer.

In S404, a first silicon oxide layer is formed on a surface of the first spin-coated hard mask layer.

Specifically, in the S402, by a spin-coating process, the first spin-coated hard mask layer 206 is formed on an upper surface of the second dielectric layer 106, for example, a carbon hard mask layer is spin-coated.

Specifically, in the S404, the first silicon oxide layer 208 is formed on a surface of the first spin-coated hard mask layer 206 via a depositing process. The step that a patterning process is performed on the mask layer 110 by taking the second patterned mask layer 108 as a mask includes: the first silicon oxide layer 208 and the first spin-coated hard mask layer 206 in the first opening 210 region are removed successively by taking the second patterned mask layer 108 as the mask to form the third patterned mask layer 304 formed by the first silicon oxide layer 208 which is remaining and the first spin-coated hard mask layer 206 which is remaining.

In one of the embodiments, the second dielectric layer 106 further includes a third silicon oxide layer 202 located between the substrate 200 and the silicon oxynitride layer 204.

After the first conducting structure 112 is formed, a first dielectric layer 114 is formed on the base 100, the first dielectric layer 114 covers an upper surface of the base 100 and an upper surface of the first conducting structure 112.

Figure 8:
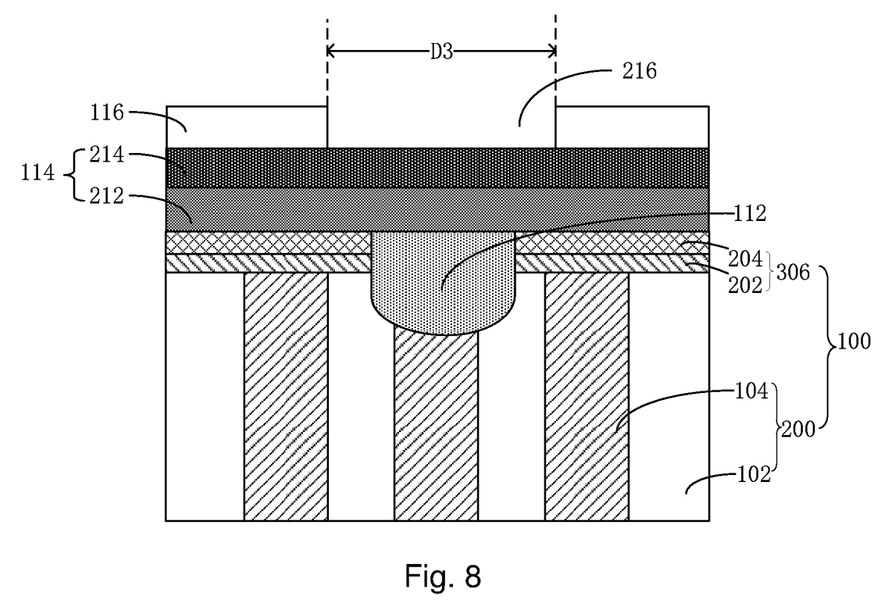
FIG. 8 is a diagrammatic cross-section of a semiconductor structure after a first patterned mask layer is formed in an embodiment.
Figure 9:
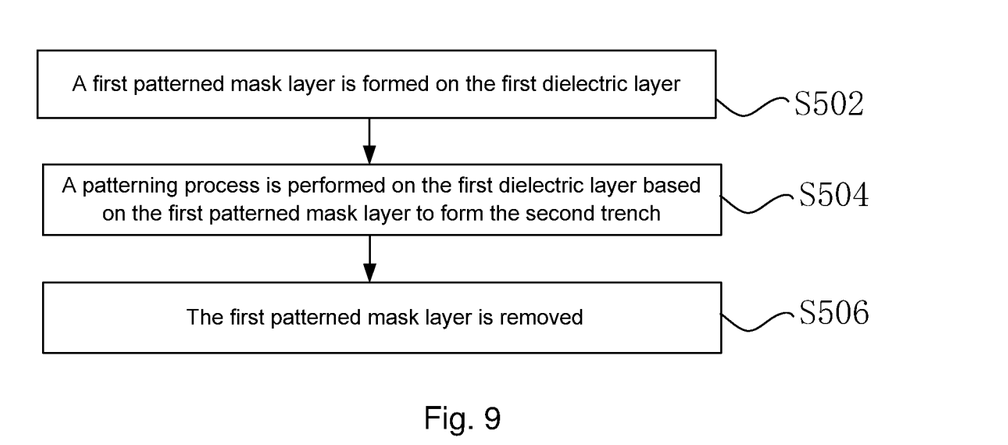
FIG. 9 is a flow diagram of forming a second trench in a first dielectric layer in an embodiment.

Referring to FIG. 8, it is a diagrammatic cross-section of a semiconductor structure after a first patterned mask layer is formed in an embodiment. Referring to FIG. 9, it is a diagrammatic cross-section of a semiconductor structure after the second trench is formed in an embodiment.

Figure 10:
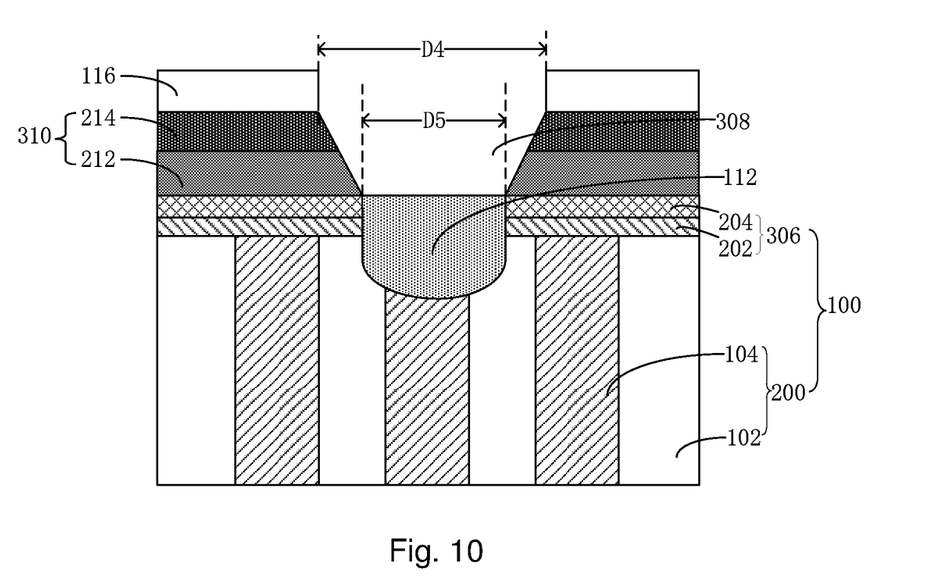
FIG. 10 is a diagrammatic cross-section of a semiconductor structure after a second trench is formed in an embodiment.
Figure 11:
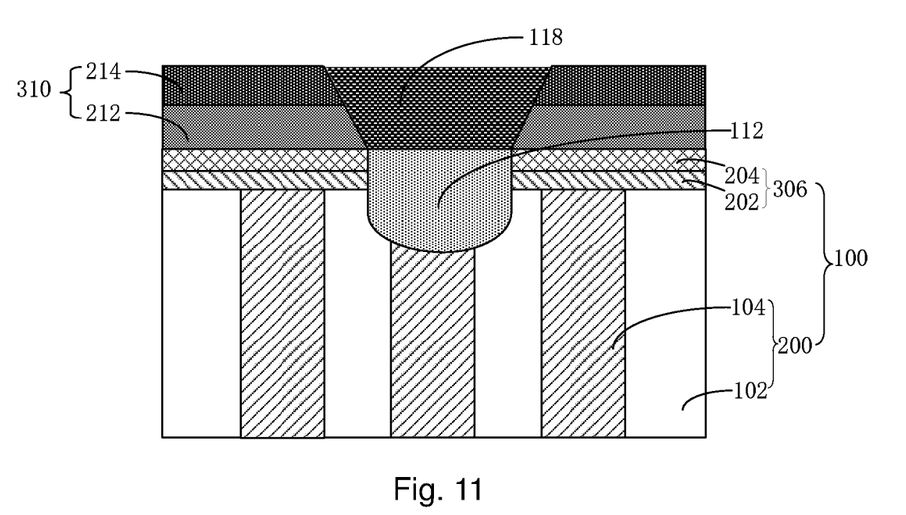
FIG. 11 is a diagrammatic cross-section of a semiconductor structure after a second conducting structure is formed in an embodiment.

Referring to FIG. 10, it is a diagrammatic cross-section of a semiconductor structure after a second trench is formed in an embodiment. Referring to FIG. 11, it is a diagrammatic cross-section of a semiconductor structure after a second conducting structure is formed in an embodiment.

As shown in FIG. 8, FIG. 9 and FIG. 10, in one of the embodiments, the S110 includes the following steps.

In S502, a first patterned mask layer is formed on the first dielectric layer.

In S504, a patterning process is performed on the first dielectric layer based on the first patterned mask layer to form the second trench.

In S506, the first patterned mask layer is removed.

Specifically, in S502, the first patterned mask layer 116 is formed on the first dielectric layer 114, the first patterned mask layer 116 defining a shape and a position of the second trench 308.

In one of the embodiments, the first dielectric layer 114 includes a second spin-coated hard mask layer 212, for example a spin-coated carbon hard mask layer, and a second silicon oxide layer 214 stacked in sequence from the second dielectric layer 106. The first dielectric layer 114 includes the second spin-coated hard mask layer 212 and the second silicon oxide layer 214 that are successively formed from an upper surface of the first conducting structure 112 and an upper surface of the second dielectric structure 306.

Specifically, the first patterned mask layer 116 is formed on the second silicon oxide layer 214, the first patterned mask layer 116 defines a shape and a position of the second trench 308, that is, a width D3 of a second opening 216 of the first patterned mask layer 116 is as same as a width D4 of a top of the second trench 308, and the first dielectric layer 114 exposed in the second opening 216 is located above the first conducting structure 112.

Specifically, in S504, a patterning process is performed on the second silicon oxide layer 214 and the second spin-coated hard mask layer 212 successively by an etching process by taking the first patterned mask layer 116 as a mask, the second silicon oxide layer 214 which is exposed and second spin-coated hard mask layer 212 which is exposed are removed to form the first dielectric structure 310 formed by the second silicon oxide layer 214 which is remaining and the second spin-coated hard mask layer 212 which is remaining as well as the second trench 308 exposed the first conducting structure 112.

In one of the embodiments, a process gas that forms the second trench 308 in the S504 includes difluoromethane, hexachlorobutadiene, oxygen and nitrogen.

In one of the embodiments, a width D5 of a bottom of the second trench 308 is equal to a width D2 of a top of the first trench 302.

In one of the embodiments, the second trench 308 is an inverted trapezoidal trench.

Specifically, as shown in FIG. 10 and FIG. 11, in the S506, the first patterned mask layer 116 on a surface of the first dielectric structure 310 is removed, the second conducting structure 118 is formed in the second trench 308, and a bottom of the second conducting structure 118 is in contact with an upper surface of the first conducting structure 112 and is used to realize electrical connection between the active regions 104 below the first conducting structure 112 and the second conducting structure 118.

In one of the embodiments, an upper surface of the second conducting structure 118 is aligned with an upper surface of the first dielectric layer 114, that is, the second trench 308 is filled with the second conducting structure 118.

In one of the embodiments, an upper surface of the second conducting structure 118 is lower than an upper surface of the first dielectric layer 114.

In one of the embodiments, each of the first conducting structure 112 and the second conducting structure 118 at least includes a polysilicon structure, a tungsten conducting structure or a titanium nitride structure.

In one of the embodiments, the first conducting structure 112 and the second conducting structure 118 jointly form the bit line contact structure. Compared with the bit line contact structure which is used to lead out the active region and filled in a contact hole, the contact hole exposes the active regions and formed through a etch process after the first dielectric layer 114, the bit line contact structure in the present disclosure is formed by etching and filling in two steps, and a deep-width ratio of etching and filling is low, such that a problem that a contact resistance is increased as voids are formed in the bit line contact structure is avoided.

In one of the embodiments, both the first patterned mask layer 116 and the second patterned mask layer 108 are spin-coated carbon hard mask layers.

In one of the embodiments, the present disclosure further provides a semiconductor structure. The semiconductor structure is manufactured by any one of methods for manufacturing the semiconductor structure.

As shown in FIG. 6, FIG. 8, FIG. 10 and FIG. 11, in one of the embodiments, the present disclosure further provides a semiconductor structure, the semiconductor structure includes:

a base 100, at least one shallow trench isolating structure 102 is formed in the base 100 and several active regions 104 arranged at an interval are isolated by the shallow trench isolating structure 102 in the base 100;

a first trench 302, located in the base 100, a part of the active regions 104 is exposed.

a first conducting structure 112, fills the first trench 302 fully;

a first dielectric layer 114, located on the base 100;

a second trench 308, located in the first dielectric layer 114, the first conducting structure 112 is exposed in the second trench 308 and a width D4 of a top of the second trench 308 is greater than a width D2 of a top of the first trench 302;

a second conducting structure 118, located in the second trench 308.

The semiconductor structure of the present disclosure includes the first trench located on the base, the first trench is filled with the first conducting structure fully; the second trench exposed out of the first conducting structure is formed in the first dielectric layer on the base and the second trench is filled with the second conducting structure, the width of the top of the second trench is greater than the width of the top of the first trench. Compared with operations of filling the conducting structures successively after the trench with the same width up and down by adopting a one-step etching process, a depth-to-width ratio of the trench when the conducting structures are formed by filling is reduced and holes are prevented from being in the first conducting structure and the second conducting structure, such that resistance of the bit line contact structure formed by the first conducting structure and the second conducting structure is further reduced.

In one of the embodiments, the first conducting structure 112 and the second conducting structure 118 jointly form the bit line contact structure. Compared with the bit line contact structure which is used to lead out the active region and filled in a contact hole, the contact hole exposes the active regions and formed through a etch process after the first dielectric layer 114, the bit line contact structure in the present disclosure is formed by etching and filling in two steps, and a deep-width ratio of etching and filling is low, such that a problem that a contact resistance is increased as voids are formed in the bit line contact structure is avoided.

In one of the embodiments, a width D5 of a bottom of the second trench 308 is equal to a width D2 of a top of the first trench 302. The second trench 308 is an inverted trapezoidal trench.

In one of the embodiments, an upper surface of the second conducting structure 118 is aligned with an upper surface of the first dielectric layer 114.

In one of the embodiments, an upper surface of the second conducting structure 118 is lower than an upper surface of the first dielectric layer 114.

In one of the embodiments, each of the first conducting structure 112 and the second conducting structure 118 at least includes a polysilicon structure, a tungsten conducting structure or a titanium nitride structure.

In one of the embodiments, the second patterned mask layer 212 is the spin-coated carbon hard mask layer.

As shown in FIG. 4 and FIG. 8, in one of the embodiments, the base 100 includes a substrate 200 and a second dielectric layer 106 located on an upper surface of the substrate 200. The first dielectric layer 114 includes a second spin-coated hard mask layer 212 and a second silicon oxide layer 214 stacked in sequence from the second dielectric layer 106 (i.e., a second dielectric structure 306). The second dielectric layer 106 includes a third silicon oxide layer 202 and a silicon oxynitride layer 204 stacked in sequence from the substrate 200.

It will be appreciated that although various steps in the flow charts of FIG. 1 are shown sequentially as indicated by the arrows, these steps are not necessarily performed sequentially as indicated by the arrows. Unless explicitly stated otherwise herein, the steps are not performed in a strict order limitation, and the steps may be performed in other orders. Moreover, at least part of the steps of FIG. 1 may include a plurality of steps or phases that are not necessarily performed at the same time, but may be performed at different times. The steps or phases are not necessarily performed sequentially, but may be performed in turn or alternately with at least part of the other steps or the steps or phases of the other steps.

The technical features of the above embodiments may be combined freely. In order to describe briefly, the description is not made on all possible combinations of the technical features of the embodiments. However, the combinations of these technical features should be considered as a scope of the specification as long as there is no contradiction.

The above embodiments only express several embodiments of the present disclosure, are described in more detail, but are not to be construed as a limitation to the scope of the applied patent. It is to be noted that several variations and modifications may also be made by those skilled in the art without departing from the spirit of the present disclosure, which all fall within the protection scope of the present disclosure. Therefore, the protection scope of the patent of the present disclosure shall be subjected to the appended claims.

What is claimed is:

1. A method for manufacturing a semiconductor structure, comprising:
   providing a base, at least one shallow trench isolating structure being formed in the base and several active regions arranged at an interval being isolated by the at least one shallow trench isolating structure in the base;
   forming a first trench in the base, a part of the several active regions being exposed in the first trench;
   forming a first conducting structure in the first trench, the first trench being filled with the first conducting structure;
   forming a first dielectric layer on the base, the first dielectric layer covering an upper surface of the base and an upper surface of the first conducting structure;
   forming a second trench in the first dielectric layer, the first conducting structure being exposed in the second trench and a width of a top of the second trench being greater than a width of a top of the first trench; and
   forming a second conducting structure in the second trench, wherein:
   the second trench is an inverted trapezoidal trench,
   each of the first conducting structure and the second conducting structure at least comprises a polysilicon structure, and
   a mask layer used to form the first trench comprises a first spin-coated hard mask layer and a first silicon oxide layer stacked in sequence from a second dielectric layer of the base, the first dielectric layer comprises a second spin-coated hard mask layer and a second silicon oxide layer stacked in sequence from the second dielectric layer.

2. The method according to claim 1, wherein the first conducting structure and the second conducting structure jointly form a bit line contact structure.

3. The method according to claim 2, wherein forming the second trench in the first dielectric layer comprises:
   forming a first patterned mask layer on the first dielectric layer, the first patterned mask layer defining a shape and a position of the second trench;
   performing a patterning process on the first dielectric layer based on the first patterned mask layer to form the second trench; and
   removing the first patterned mask layer.

4. The method according to claim 1, wherein a width of a bottom of the second trench is equal to the width of the top of the first trench.

5. The method according to claim 4, wherein forming the second trench in the first dielectric layer comprises:

forming a first patterned mask layer on the first dielectric layer, the first patterned mask layer defining a shape and a position of the second trench;

performing a patterning process on the first dielectric layer based on the first patterned mask layer to form the second trench; and removing the first patterned mask layer.

6. The method according to claim 1, wherein forming the second trench in the first dielectric layer comprises:

forming a first patterned mask layer on the first dielectric layer, the first patterned mask layer defining a shape and a position of the second trench;

performing a patterning process on the first dielectric layer based on the first patterned mask layer to form the second trench; and removing the first patterned mask layer.

7. The method according to claim 6, wherein a process gas for performing the patterning process on the first dielectric layer based on the first patterned mask layer to form the second trench comprises:

difluoromethane, hexafluorbutadiene, oxygen and nitrogen.

8. The method according to claim 1, wherein an upper surface of the second conducting structure is aligned with an upper surface of the first dielectric layer.

9. The method according to claim 1, wherein the base comprises a substrate and the second dielectric layer located on an upper surface of the substrate;

forming the first trench in the base comprises:

forming a second patterned mask layer on the second dielectric layer, the second patterned mask layer defining a shape and a position of the first trench; and performing a patterning process on the second dielectric layer based on the second patterned mask layer to form the first trench, wherein the first trench penetrates through the second dielectric layer and extends into the substrate.

10. The method according to claim 9, before forming the second patterned mask layer on the second dielectric layer, further comprising:

forming the mask layer on the second dielectric layer;

performing the patterning process on the second dielectric layer based on the second patterned mask layer to form the first trench comprises:

performing a patterning process on the mask layer based on the second patterned mask layer to form a third patterned mask layer; and performing a patterning process on the second dielectric layer based on the third patterned mask layer to form the first trench.

11. The method according to claim 10, wherein a process gas for performing the patterning process on the second dielectric layer based on the third patterned mask layer to form the first trench comprises:

hexafluorbutadiene, oxygen and nitrogen.

12. The method according to claim 10, wherein the second dielectric layer comprises a silicon oxynitride layer formed on the substrate;

forming the mask layer on the second dielectric layer comprises:

forming the first spin-coated hard mask layer on the second dielectric layer; and forming the first silicon oxide layer on a surface of the first spin-coated hard mask layer;

after performing the patterning process on the mask layer based on the second patterned mask layer to form a third patterned mask layer, the method further comprising:

removing the second patterned mask layer; and after performing the patterning process on the second dielectric layer based on the third patterned mask layer to form the first trench, the method further comprising:

removing the third patterned mask layer.

13. A semiconductor structure, comprising:

a base, at least one shallow trench isolating structure being formed in the base and several active regions arranged at an interval being isolated by the at least one shallow trench isolating structure in the base;

a first trench located in the base, a part of the several active regions being exposed in the first trench;

a first conducting structure filling the first trench fully;

a first dielectric layer located on the base;

a second trench located in the first dielectric layer, the first conducting structure being exposed in the second trench and a width of a top of the second trench being greater than a width of a top of the first trench; and a second conducting structure located in the second trench, wherein:

the second trench is an inverted trapezoidal trench, each of the first conducting structure and the second conducting structure at least comprises a polysilicon structure, and the first dielectric layer comprises a second spin-coated hard mask layer and a second silicon oxide layer stacked in sequence from a second dielectric layer of the base.

14. The semiconductor structure according to claim 13, wherein the first conducting structure and the second conducting structure jointly form a bit line contact structure.

15. The semiconductor structure according to claim 13, wherein a width of a bottom of the second trench is equal to the width of the top of the first trench.

16. The semiconductor structure according to claim 13, wherein an upper surface of the second conducting structure is aligned with an upper surface of the first dielectric layer.

17. The semiconductor structure according to claim 13, wherein the base comprises a substrate and the second dielectric layer located on an upper surface of the substrate, and the second dielectric layer comprises a third silicon oxide layer and a silicon oxynitride layer stacked in sequence from the substrate.

\* \* \* \* \*